(12) United States Patent
Ahn

(10) Patent No.: US 7,203,232 B2
(45) Date of Patent: Apr. 10, 2007

(54) APPARATUS AND METHOD FOR ADJUSTING FILTER TAP LENGTH OF ADAPTIVE EQUALIZER BY USING TRAINING SEQUENCE

(75) Inventor: Young-ho Ahn, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 689 days.

(21) Appl. No.: 09/823,754

(22) Filed: Apr. 3, 2001

(65) Prior Publication Data

US 2002/0012391 A1   Jan. 31, 2002

(30) Foreign Application Priority Data

Jun. 20, 2000   (KR) ............................... 2000-33921

(51) Int. Cl.
*H03H 7/30* (2006.01)
(52) U.S. Cl. .................. 375/231; 375/232; 348/614
(58) Field of Classification Search ............... 348/614, 348/21, 607, 611, 731, 426.1; 375/148, 130, 375/331, 370, 232, 233, 230, 231; 455/296, 455/65
See application file for complete search history.

(56) References Cited

U.S. PATENT DOCUMENTS

| | | | | |
|---|---|---|---|---|
| 4,393,397 A | * | 7/1983 | Holmes | 348/614 |
| 4,575,857 A | * | 3/1986 | Murakami | 375/230 |
| 4,912,557 A | * | 3/1990 | Faroudja | 348/614 |
| 5,065,242 A | * | 11/1991 | Dieterich et al. | 348/614 |
| 5,081,643 A | * | 1/1992 | Schilling | 375/130 |
| 5,161,017 A | * | 11/1992 | Sato | 348/614 |
| 5,285,280 A | * | 2/1994 | Teng et al. | 348/614 |
| 5,481,316 A | * | 1/1996 | Patel | 348/614 |
| 5,604,541 A | * | 2/1997 | Kim et al. | 348/426.1 |
| 5,623,318 A | * | 4/1997 | Lee | 348/614 |
| 5,630,208 A | * | 5/1997 | Enge et al. | 455/65 |
| 6,031,882 A | * | 2/2000 | Enge et al. | 375/343 |
| 6,222,592 B1 | * | 4/2001 | Patel | 348/614 |
| 6,377,312 B1 | * | 4/2002 | Limberg et al. | 348/614 |
| 6,384,858 B1 | * | 5/2002 | Limberg | 348/21 |
| 6,441,843 B1 | * | 8/2002 | Limberg | 348/21 |
| 6,526,093 B1 | * | 2/2003 | Bao et al. | 375/233 |
| 6,611,548 B2 | * | 8/2003 | Lomp | 375/148 |

(Continued)

OTHER PUBLICATIONS

Jerry C. Whitaker; tvhandbook.com; ATSC DTV Receiver Systems; Chapter 17.2; pp. 17-63-to-17-99.*

(Continued)

*Primary Examiner*—Tesfaldet Bocure
*Assistant Examiner*—Sudhanshu C. Pathak
(74) *Attorney, Agent, or Firm*—Sughrue Mion, PLLC

(57) ABSTRACT

An apparatus and method for adjusting the filter tap length of an adaptive equalizer using a training sequence, determining a required filter tap length by using multipath information detected from correlation values of sync symbols of a segment for data synchronization, training sequence for field synchronization and input data, and auto correlation values of the training sequence. In the case of a VSB signal, the presence or absence of a multipath detector, and the position and size thereof, can be identified from the correlation value by using a 704-symbols field sync signal. Also, the-pre-/post-ghosts which are farthest from the main tap are detected using the position of a multipath detector, thereby determining the tap length of the adaptive equalizer in a variable manner. Thus, the performance of the adaptive equalizer can be improved, and the power consumption can also be reduced.

11 Claims, 4 Drawing Sheets

U.S. PATENT DOCUMENTS 6,693,958 B1 * 2/2004 Wang et al. ................. 375/232
6,816,548 B1 * 11/2004 Shiue et al. ................. 375/233

OTHER PUBLICATIONS

"www.thefreedictionary.com"; Multiplexer; pp. 1-3.*
ATSC—Digital Television Standard (Annex D), Sep. 16th, 1995; pp. 46-60.*

Kim et al.; A New Ghost Cancellation System for Korean GCR; IEEE Transcations on Broadcasting; vol. 40, No. 3; Sep. 1994; pp. 132-140.*

Huang, J.; A Ghost Cancellation System for the NTSC Television; IEEE Transactions on Consumer Electronics; vol. 39, No. 4; Nov. 1993; pp. 896-904.*

* cited by examiner

APPARATUS AND METHOD FOR ADJUSTING FILTER TAP LENGTH OF ADAPTIVE EQUALIZER BY USING TRAINING SEQUENCE

BACKGROUND OF THE INVENTION

1. Field of the Invention

The present invention relates to an apparatus and method for adjusting the filter tap length of an adaptive equalizer, and more particularly, to an apparatus and method for adjusting the filter tap length of an adaptive equalizer using a training sequence, and for determining a required filter tap length by using multipath information detected from correlation values of synchronization symbols of a segment for data synchronization, training sequence symbols for field synchronization and input data, and from auto correlation values of the training sequence symbols. The present application is based on Korean Patent Application No. 00-33921 filed Jun. 20, 2000.

2. Description of the Related Art

A vestigial side band (VSB) digital transmission system has a transmitter for receiving data, converting the data input into a transmission format, and transmitting the converted data through a transmission channel, and a receiver for converting the data received from the transmitter through a transmission channel into a reception format and transmitting the converted data.

FIG. 1A shows a data frame of a VSB transmission system. A frame consists of segments which have 832 symbols each, and each of the segments includes four symbols of segment synchronization (to be abbreviated as 'sync' hereinafter) signal, 828 symbols of data and a FEC (Forward Error Correction) signal. Each data frame has 313 segments, one of which is a data field sync segment containing training sequence and 312 of which are general data segments. FIG. 1B shows a data field sync segment. The training sequence is a signal contained in the field sync signal, transmitted from the transmitter to the receiver, used as a field sync signal with pseudo noise (PN) symbols of 511/63/63/63 and 511/63/-63/63 alternating. In other words, while the training sequences in odd fields are identical with the training sequences in even fields, the signs of the second ones among three consecutive PN 63 sequences are opposite to each other.

An adaptive equalizer is a system element used in the receiver for compensation of channel distortion, such as tilt and ghost, caused by defective system elements that are in a transmission channel or a receiver. The number of taps of the adaptive equalizer is generally determined by the maximum range of ghosts to be canceled. In order to detect and cancel ghosts, 63 symbol sequences, that is, PN 63 sequences, in which symbols of training sequences are alternately reversed, have been conventionally used, which is similar to a ghost canceling method using a group coded recording (GCR) in conventional analog television systems.

The conventional ghost canceling method using the PN 63 sequences, however, has the following problems.

First, since only 63 symbols are used, the range of detecting and canceling ghosts is limited. For example, in the case of a VSB signal having a symbol rate of 10.75 MHz, post-ghosts of approximately +5.86 µs can only be canceled, which is a very limited range when compared with the existing VSB adaptive equalizer standard in which ghosts of 18.76 µs can be canceled.

Second, in order to cancel ghosts in a similar way to that adopted by the existing NTSC (National Television System Committee) analog transmission system, at least two PN 63 sequences must be examined, which may cause a delay in ghost detection time. In other words, since the conventional ghost detecting and canceling method utilizes the properties of PN 63 sequences, the signs of which, either positive (+) or negative (−), alternate at field sync signals, ghost information cannot be known until at least two field sync signals constituting one frame are processed.

SUMMARY OF THE INVENTION

The present invention has been made in view of the above problems and it is an object of the present invention to provide an apparatus and method for adjusting the filter tap length of an adaptive equalizer, by which the number of taps of the adaptive equalizer can be applied in a variable manner.

It is another object of the present invention to provide an apparatus and method for adjusting the filter tap length of an adaptive equalizer, which can improve the performance of the adaptive equalizer and can reduce the power consumption thereof.

Additional objects and advantages of the invention will be set forth in part in the description which follows and in part will be obvious from the description, or may be learned by practice of the invention.

To achieve the objects and in accordance with the purpose of the invention, there is provided an apparatus for adjusting the filter tap length for an adaptive equalizer including a multipath detector for detecting multipath information from a difference between the correlation values of input data applied to the adaptive equalizer and a training sequence, which includes 4 symbol segment sync and 511/63/63/63 PN sequence, and from the auto correlation value of a training sequence in the case where a training sequence is valid, and a tap length adjusting unit for generating a tap length control signal based on the positions of the farthest pre-/post-ghosts by using the detected multipath information and the field sync signal.

The multipath detector may include a first multiplexer for enabling the input data applied to the adaptive equalizer in the case where the field sync signal is logic "high", which means training sequence is valid, and outputting the enabled data, a second multiplexer for enabling the training sequence in the case where the field sync signal is logic "high" and outputting the enabled signal, a first sync sequence correlator for calculating the correlation value of the data output from the first multiplexer and a 704-symbol training sequence, a second training sequence correlator for calculating the correlation value of the reference signal output from the second multiplexer and the 704-symbol training sequence, and a subtractor for subtracting the output signal of the second sync sequence correlator from the output signal of the first sync sequence correlator to detect multipath information.

The tap length adjusting unit may include an absolute value calculator for obtaining the absolute value of the output of the subtractor which is used as the multipath information obtained from the multipath detector, a threshold comparator for comparing the obtained absolute value with a threshold value and outputting only the correlation values exceeding the threshold value, a counter for counting field sync sections delayed by the time taken in obtaining the correlation value, a ghost detector for detecting the position of a ghost from the correlation value obtained by the threshold comparator for the delayed field sync sections counted by the counter, and a tap length table for matching the tap length so as to cover the detected pre-/post-ghosts to output the tap length control signal.

The tap length table is preferably classified into one or more sections according to the distance from the main tap, and a predetermined number of taps is set to each section.

To accomplish another object of the present invention, there is provided a method for adjusting the filter tap length for an adaptive equalizer including the steps of detecting multipath information from the correlation values of input data applied to the adaptive equalizer and a training sequence, and from the auto correlation value of a training sequence, and determining a required filter tap length by using the detected multipath information.

The multipath detecting step may include the sub-steps of (a) inputting data, (b) obtaining the correlation value between the data input in the step (a) and a reference signal consisting of 704 known symbols, (c) obtaining a difference between the correlation value obtained in the step (b) and the auto correlation value of the reference signal, and (d) detecting multipath information from the difference obtained in the step (c).

The tap length determining step may include the sub-steps of (a) detecting the positions of pre-/post-ghosts farthest from the main tap using the multipath information obtained in the multipath detecting step, and (b) adjusting the tap length so as to cover the positions of the ghosts detected in the step (a).

BRIEF DESCRIPTION OF THE DRAWINGS

The above objects and features of the present invention will become more apparent by describing in detail a preferred embodiment thereof with reference to the attached drawings in which.

DESCRIPTION OF THE PREFERRED EMBODIMENT

The above objects and other advantages of the present invention will become more apparent by describing in detail a preferred embodiment thereof with reference to the attached drawings.

Figure 1A:
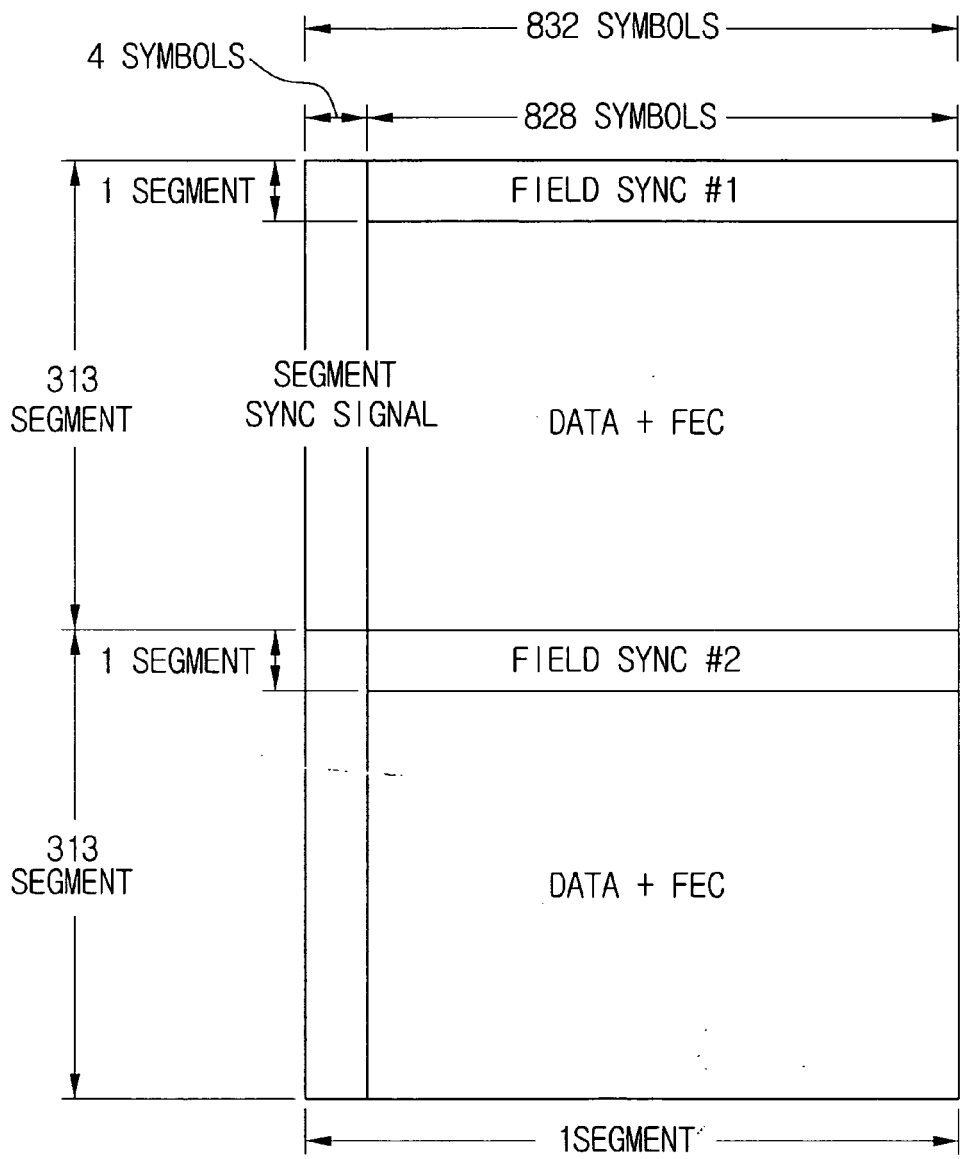
FIG. 1A is a diagram of a data frame of a VSB digital transmission system.
Figure 1B:
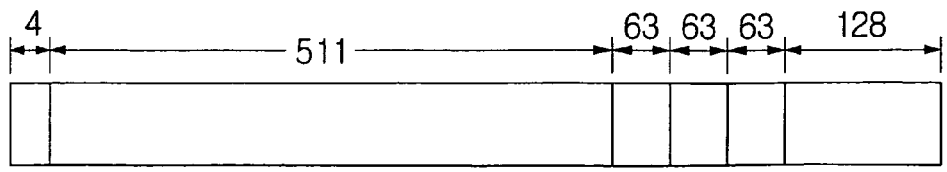
FIG. 1B is a diagram of a data field sync segment.

A VSB transmission system has field sync signals each containing segment sync signal and a training sequence signal composed of 511/63/63/63 sequences shown in FIG. 1B. The training sequence signal which is transmitted from a transmitter to a receiver, is a known signal. A 4-symbol segment sync signal exists ahead of the field sync signal and is also a known signal. Thus, 704 (4+511+63+63+63) symbols are all known, and let the known 704 symbols be a reference signal Sr. A tap length adjusting device for an adaptive equalizer according to the present invention shown in FIG. 2, detects multipath information by obtaining a signal similar to the impulse response of a channel from a difference between a correlation value of input data and a correlation value of the reference signal Sr consisting of the known 704 symbols. Provided that a training sequence be represented by t(n) and an impulse response of a channel be represented by h(n), an input signal Di applied to the filter tap length adjusting device for an adaptive equalizer according to the present invention, can be represented as follows:

$$Di = t(n) * h(n) \tag{1}$$

where i and n are positive integers.

Figure 2:
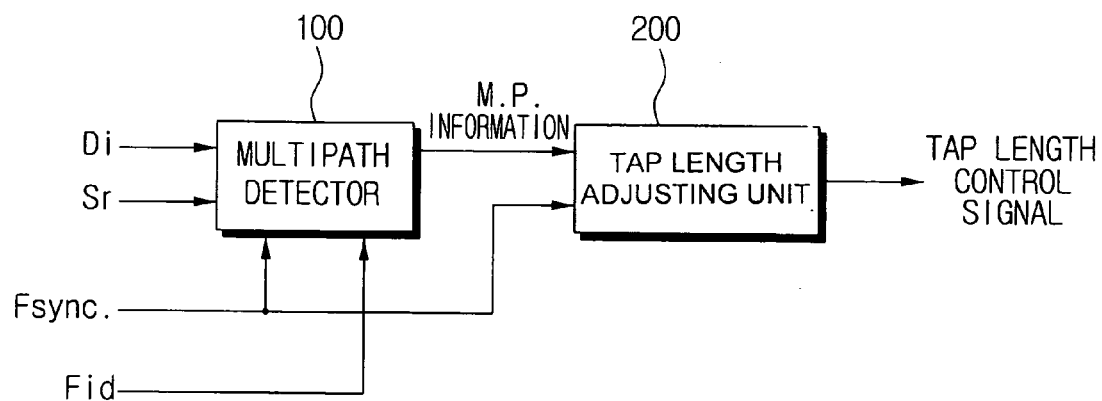
FIG. 2 is a block diagram of a filter tap length adjusting device for an adaptive equalizer according to the present invention.
Figure 3A:
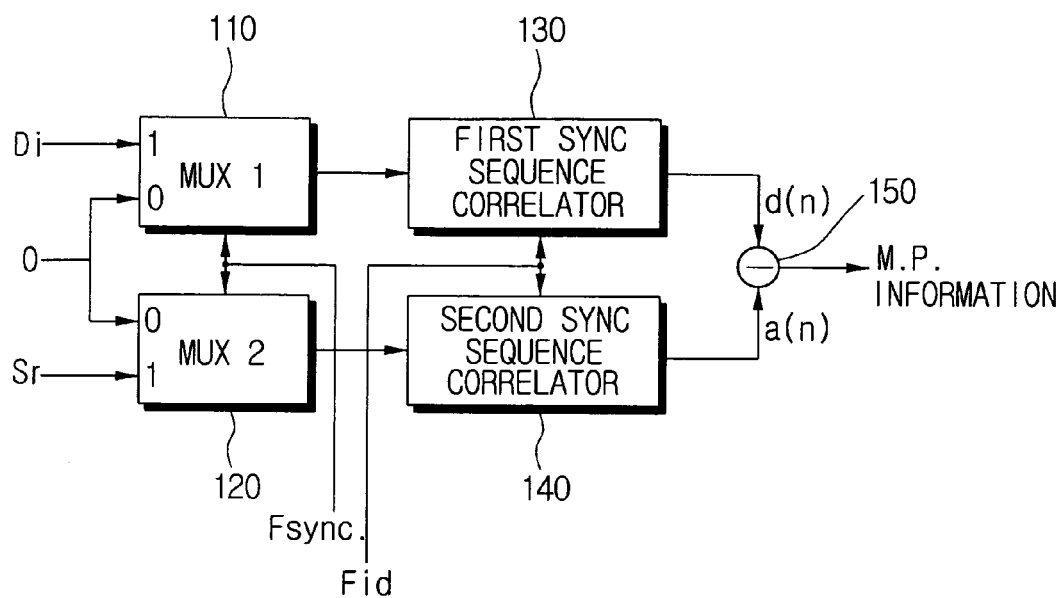
FIG. 3A is a block diagram of the multipath detector for a VSB signal shown in FIG. 2.

As shown in FIG. 2, the filter tap length adjusting device for an adaptive equalizer according to the present invention includes a multipath detector 100 and a tap length adjusting unit 200. The multipath detector 100 detects multipath information (M.P. information) from a difference between the correlation value of the input data Di applied to the adaptive equalizer and the correlation value of the reference signal Sr if a field sync signal Fsync. is logic "high." As shown in FIG. 3A, the multipath detector 100 is synchronized by a field identifier Fid (see FIG. 2), and includes a first multiplexer (MUX1) 110, a second multiplexer (MUX2) 120, a first sync sequence correlator 130, a second sync sequence correlator 140 and a subtractor 150. If the field sync signal Fsync. is logic "high," the MUX1 110 enables the input data Di applied to the adaptive equalizer and outputs the enabled data to the first sync sequence correlator 130. Also, when the field sync signal Fsync. is logic "high," the MUX2 120 enables the reference signal Sr and outputs the enabled signal to the second sync sequence correlator 140. The forgoing reduces the power consumption such that the first and second sync sequence correlators 130 and 140 are not allowed to operate while no correlation value is necessary.

The first sync sequence correlator 130 calculates a correlation value d(n) between the data Di output from the MUX1 110 and the training sequence t(n).

$$d(n) = Di * t(n) = t(n) * h(n) * t(n) = h(n) * t(n) * t(n) \tag{2}$$

where d(n) is the convolution of the auto correlation value of t(n) and the impulse response h(n) of a channel.

The impulse response of a channel, that is, h(n), can be expressed by the sum of a delta function (n) and multipath m(n).

$$h(n) = \delta(n) + m(n) \tag{3}$$

The second sync sequence correlator 140 calculates a correlation value a(n) of the reference signal Sr output from the MUX2 120.

$$a(n) = t(n) * t(n) = t(n) * t(n) * \delta(n) \tag{4}$$

The first sync sequence correlator 130 and the second sync sequence correlator 140 are synchronized by a field identifier Fid. The field identifier Fid is information for 63 sequences with +/− signs reversed.

The subtractor 150 subtracts the output signal a(n) of the second sync sequence correlator 140 from the output signal d(n) of the first sync sequence correlator 130.

$$d(n) - a(n) = [h(n) * t(n) * t(n)] - [t(n) * t(n) * \delta(n)] \quad (5)$$
$$= [(\delta(n) + m(n)) * t(n) * t(n)] - [t(n) * t(n) * \delta(n)]$$
$$= m(n) * t(n) * t(n)$$

Figure 4A:
FIG. 4A is a diagram showing a correlation value a(n) of a reference signal.
Figure 4B:
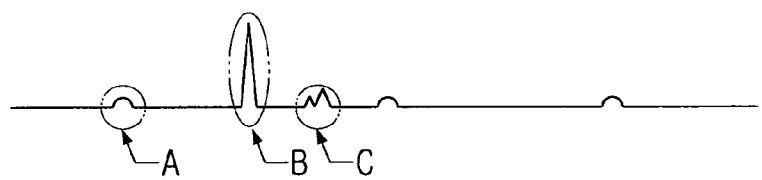
FIG. 4B is a diagram showing a correlation value d(n) in the case where a multipath is added.
Figure 5:
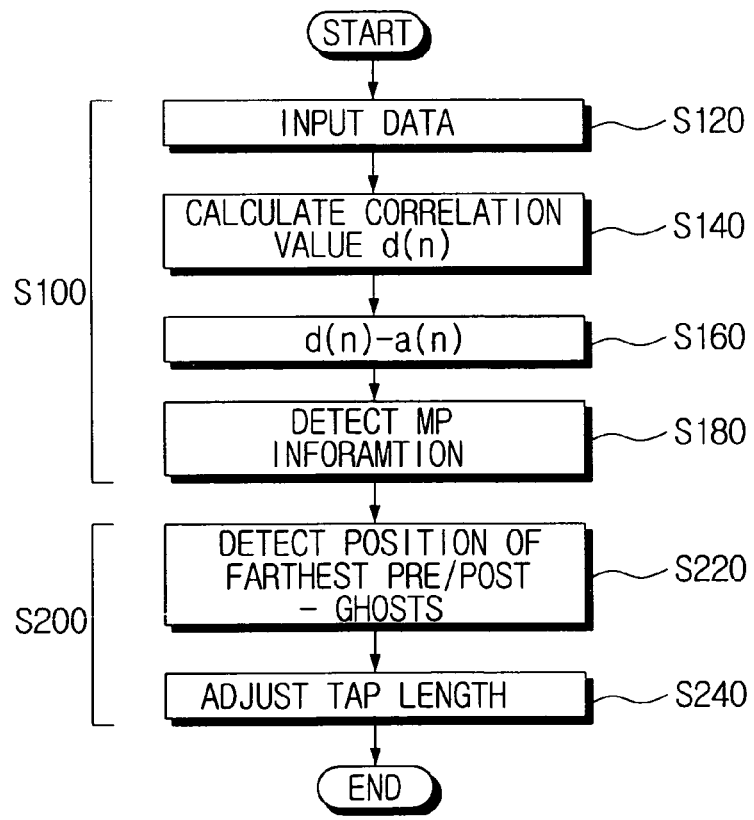
FIG. 5 is a flow diagram showing a method for adjusting the filter tap length of an adaptive equalizer according to the present invention.

Here, the output of the subtractor 150 can be used as the multipath (M.P.) information by using the auto correlation value of t(n) having a response similar to δ (n), which will now be described with reference to FIGS. 4A and 4B. In the case of correlation values of field sync portions of a VSB format, the correlation values of sync parts are particularly high, compared to the other parts, and the correlation values are not zero's, either. In FIGS. 4A and 4B, a portion "A" represents the correlation value based on the PN 63sequence, and a portion "B" represents the correlation value based on the main tap portion. A portion "C" represents the correlation value based on the multipath and corresponds to a difference between the correlation value d(n) in the case where a multipath is added, as shown in FIG. 4B, and the correlation value a(n) of the reference signal, as shown in FIG. 4A. Since correlators are blocks requiring a considerable amount of hardware capacity, it is necessary to decide the appropriate resolution of the correlators. In the present invention, ghost detection can be sufficiently performed with the resolution of approximately three upper significant bits of an input signal. In this regard, simulation results showed that detection of ghosts of approximately −22 dB could be implemented in the case of using only three upper significant bits of an input signal.

On the other hand, in the case where only a required hardware capacity matters, and fast multipath detection is not so important an issue, small-capacity correlators, which exhibit very low throughput, may be implemented by using a general-purpose memory and a digital signal processor (DSP) structure.

Also, since the correlation value of the reference signal Sr is for known signals, it can be computed in advance, which makes it possible to replace the MUX2 120 and the second sync sequence correlator 140 with ROM's.

Figure 3B:
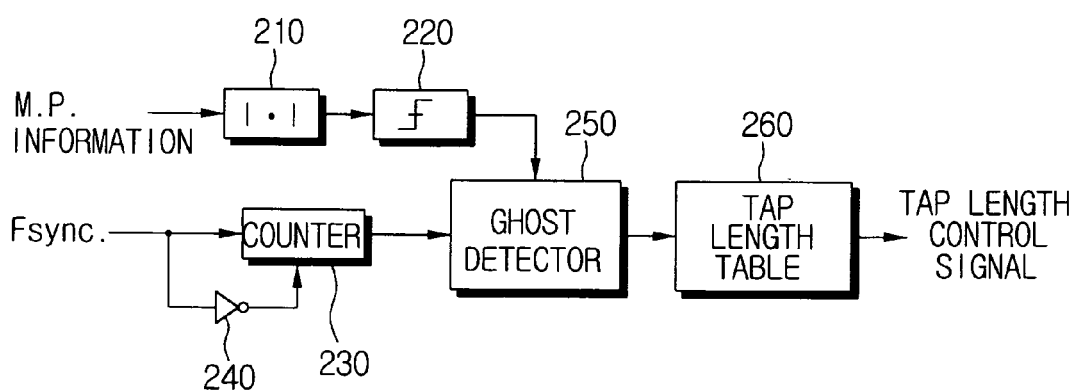
FIG. 3B is a block diagram of the tap length adjusting unit for a VSB signal shown in FIG. 2.

As shown in FIG. 2, the tap length adjusting unit 200 receives the multipath information detected by the multipath detector 100 and the field sync signal Fsync. and generates a tap length control signal based on the positions of farthest pre-/post-ghosts. As shown in FIG. 3B, the tap length adjusting unit 200 includes an absolute value calculator 210, a threshold comparator 220, a counter 230, an inverter 240, a ghost detector 250 and a tap length table 260. The absolute value calculator 210 takes the absolute values of the multipath information obtained from the multipath detector 100, that is, the difference between correlation values or the output of the subtractor 150, and outputs the same to the threshold comparator 220. The threshold comparator 220 compares the computed absolute value with a threshold value and outputs only the correlation values exceeding the threshold value to the ghost detector 250. The counter 230 counts the field sync section delayed by the time taken in obtaining the correlation values. The field sync signal Fsync. is controlled by a field sync signal having passed through the inverter 240. The ghost detector 250 detects the positions from the correlation values obtained from the threshold comparator 220 during the delayed field sync sections counted by the counter 230. The tap length table 260 matches the tap length so as to cover the detected pre-/post-ghosts to then output a tap length control signal. The tap length table 260 is classified into several sections according to the distance from the main tap, and a predetermined number of taps is set to each section. In this embodiment, a pre-cursor portion in which the pre-ghosts are detected is divided into first through third sections and 40 taps, 60 taps and 80 taps are applied to the respective sections. The time interval of each section can be determined at a user's discretion. If there exists a ghost in the boundary of each of the respective sections, a margin which is adjustable by a user is allowed so that the greater tap length can be selected. In this embodiment, the maximum tap margin is set to 8 taps. A post-cursor portion in which the post-ghosts are detected is divided into 7 sections. Also, as a section is farther from the main tap, a larger number of taps is assigned. Although the number of sections and the tap lengths are fixed in this embodiment, the tap lengths may be externally input or can be automatically adjusted using a multipath detector. In other words, in order to satisfy only the existing Advanced Television Systems Committee (ATSC) standard, that is, detection of post-ghosts of 18.76 μs, the tap length can be fixed to 224 taps.

In the apparatus and method for adjusting the filter tap length of an adaptive equalizer according to the present invention, in the case of a VSB signal, the presence or absence of a multipath, and the position and size thereof, can be identified from the correlation value by using a 704-symbol field sync signal. Also, the pre-/post-ghosts which are farthest from the main tap are detected using the position of a multipath, thereby determining the tap length of the adaptive equalizer in a variable manner. Thus, the performance of the adaptive equalizer can be improved, and the power consumption can also be reduced.

Although preferred embodiments of the present invention and modifications thereof have been described in detail herein, it is to be understood that this invention is not limited to these embodiments and modifications, and that other modifications and variations may be effected by one skilled in the art without departing from the spirit and scope of the invention as defined by the appended claims.

What is claimed is:

1. An apparatus for adjusting a filter tap length for an adaptive equalizer comprising:
   a multipath detector for detecting multipath information from a difference between the correlation values of input data applied to the adaptive equalizer and a training sequence, and an auto correlation value of a training sequence when the training sequence is valid; and
   a tap length adjusting unit for generating a tap length control signal based on positions of the pre-/post-ghosts farthest from a main tap by using the detected multipath information and a field sync signal,
   wherein the tap length adjusting unit comprises:
   a threshold comparator for comparing the detected multipath information with a threshold value and outputting only correlation values exceeding the threshold value;
   a counter for counting field sync sections delayed by an amount of time taken in obtaining the correlation values;
   a ghost detector for detecting a position of a ghost from the correlation values obtained by the threshold comparator for the delayed field sync sections counted by the counter; and a tap length table for matching the tap length so as to cover the detected pre-/post-ghosts to output the tap length control signal.

2. The apparatus according to claim 1, wherein the multipath detector comprises:
  a first multiplexer for enabling the input data applied to the adaptive equalizer when the field sync signal is logic "high" and outputting enabled data;
  a second multiplexer for enabling a reference signal when the field sync signal is logic "high" and outputting an enabled signal;
  a first sync sequence correlator for calculating a correlation value of the data output from the first multiplexer and a 704-symbol training sequence;
  a second sync sequence correlator for calculating a correlation value of the reference signal output from the second multiplexer and the 704-symbol training sequence; and
  a subtractor for subtracting the output signal of the second sync sequence correlator from the output signal of the first sync sequence correlator to detect multipath information.

3. The apparatus according to claim 2, wherein the tap length adjusting unit further comprises:
  a calculator for obtaining an absolute value of the output of the subtractor which is used as the multipath information obtained from the multipath detector, and
  wherein the threshold comparator compares the obtained absolute value with the threshold value and outputs only the correlation values exceeding the threshold value.

4. The apparatus according to claim 3, wherein the tap length table is classified into sections according to a distance from a main tap, and a predetermined number of taps is set to each section.

5. A method for adjusting the filter tap length for an adaptive equalizer comprising the steps of:
  detecting multipath information from a difference between correlation values of input data applied to the adaptive equalizer and a reference signal, and from an auto correlation value of a training sequence; and
  determining a required filter tap length by detecting positions of pre-/post-ghosts farthest from a main tap using the detected multipath information,
wherein the tap length determining step comprises:
  comparing the detected multipath information with a threshold value and outputting only correlation values exceeding the threshold value;
  counting field sync sections delayed by an amount of time taken in obtaining the correlation values;
  detecting a position of a ghost from the correlation values obtained for the delayed field sync sections which are counted; and
  adjusting the tap length so as to cover the detected positions of pre-/post ghosts.

6. The method according to claim 5, wherein the multipath detecting step comprises the sub-steps of:
  (a) inputting data;
  (b) obtaining a correlation value between the data input in step (a) and a reference signal consisting of 704 known symbols;
  (c) obtaining a difference between the correlation value obtained in step (b) and the auto correlation value of the reference signal; and
  (d) detecting multipath information from the difference obtained in the step (c).

7. The method according to claim 5, wherein the input data applied to the adaptive equalizer is enabled for use in the multipath detecting when a field sync signal indicates a valid training sequence.

8. The method according to claim 5, wherein correlation operations for detecting multipath information are selectively enabled by a field sync signal.

9. The method according to claim 5, wherein the required filter tap length is determined by using a field sync signal.

10. The apparatus according to claim 1, wherein the input data applied to the adaptive equalizer is enabled for use in detecting multipath information when a field sync signal indicates a valid training sequence.

11. The apparatus according to claim 1, wherein correlation operations for detecting multipath information are selectively enabled by a field sync signal.

* * * * *